United States Patent
Cheng et al.

(10) Patent No.: US 10,229,971 B1
(45) Date of Patent: Mar. 12, 2019

(54) INTEGRATION OF THICK AND THIN NANOSHEET TRANSISTORS ON A SINGLE CHIP

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/815,061

(22) Filed: Nov. 16, 2017

(51) Int. Cl.
| | |
|---|---|
| H01L 29/06 | (2006.01) |
| H01L 29/51 | (2006.01) |
| H01L 21/8234 | (2006.01) |
| H01L 21/84 | (2006.01) |
| H01L 21/306 | (2006.01) |
| H01L 21/311 | (2006.01) |
| H01L 29/423 | (2006.01) |

(52) U.S. Cl.
CPC .... *H01L 29/0665* (2013.01); *H01L 21/30604* (2013.01); *H01L 21/31144* (2013.01); *H01L 21/823462* (2013.01); *H01L 21/845* (2013.01); *H01L 29/0603* (2013.01); *H01L 29/42368* (2013.01); *H01L 29/511* (2013.01)

(58) Field of Classification Search
CPC ........... H01L 29/0665; H01L 29/42368; H01L 21/31144; H01L 21/30604; H01L 21/823462; H01L 29/511; H01L 29/0603; H01L 21/845
See application file for complete search history.

(56) References Cited

U.S. PATENT DOCUMENTS

| | | |
|---|---|---|
| 7,183,159 B2 | 2/2007 | Rao et al. |
| 8,008,146 B2 | 8/2011 | Bangsaruntip et al. |
| 8,420,455 B2 | 4/2013 | Bangsaruntip et al. |

(Continued)

OTHER PUBLICATIONS

Cheng et al., "Nanosheet Transistors Having Different Gate Dielectric Thicknesses on the Same Chip," U.S. Appl. No. 15/404,469, filed Jan. 12, 2017. pp. 1-38.

*Primary Examiner* — Karen Kusumakar (74) *Attorney, Agent, or Firm* — Tutunjian & Bitetto, P.C.; Vazken Alexanian (57) ABSTRACT

A method is presented for integrating a first nanosheet transistor and a second nanosheet transistor on a chip. The method includes constructing the first nanosheet transistor by forming a first nanosheet stack including alternating layers of a first material and a second material over a substrate, forming a dummy gate and first spacers over the first nanosheet stack, selectively etching the alternating layers of the first material to define gaps between the alternating layers of the second material, filling the gaps with second spacers, removing the dummy gate, removing a portion of the first nanosheet stack including layers of the first and second materials, and selectively removing remaining layers of the second material such that a single layer of the first material remains intact to define a single nanosheet channel. The method includes constructing the second nanosheet transistor by forming a second nanosheet stack having multiple layers of nanosheet channels.

20 Claims, 11 Drawing Sheets

(56) References Cited

U.S. PATENT DOCUMENTS

| | | | |
|---|---|---|---|
| 8,492,228 B1 | 7/2013 | Leobandung et al. | |
| 8,941,177 B2 | 1/2015 | Adams et al. | |
| 9,362,355 B1 * | 6/2016 | Cheng | H01L 29/66742 |
| 9,490,323 B2 | 11/2016 | Rodder et al. | |
| 9,799,748 B1 * | 10/2017 | Xie | H01L 29/66553 |
| 9,831,323 B2 * | 11/2017 | Kittl | H01L 29/6681 |
| 10,014,390 B1 * | 7/2018 | Bouche | H01L 29/66553 |
| 10,050,107 B1 * | 8/2018 | Cheng | H01L 29/7848 |
| 2009/0206405 A1 | 8/2009 | Doyle et al. | |
| 2016/0020305 A1 * | 1/2016 | Obradovic | H01L 29/7391 |
| | | | 257/39 |
| 2016/0126310 A1 | 5/2016 | Rodder et al. | |

* cited by examiner

INTEGRATION OF THICK AND THIN NANOSHEET TRANSISTORS ON A SINGLE CHIP

BACKGROUND

Technical Field

The present invention relates generally to semiconductor devices, and more specifically, to integration of thick and thin oxide nanosheet metal oxide semiconductor field effect transistors (MOSFETs) on a single chip.

Description of the Related Art

In nanometer scale devices, gate structures are often disposed between fin structures or other conducting structures, such as nanosheets. In many instances, the conducting or semiconducting structures are formed closer together due to scaling to smaller node technology sizes. This can be a limiting factor in the reduction of device size scaling.

While fin field effect transistors (finFETs) and/or nanosheets can benefit from tight device-device spacing, these dimensions can limit device scaling. Further, devices needing a thicker dielectric for higher voltage operation are even more limited in the allowable dimensions. Higher voltage devices for input and/or output circuits need thicker gate dielectrics as compared to standard gate devices, which have a lower voltage and can be employed, e.g., in logic devices. However, spacing between nanosheets needs to be small to realize capacitance benefits.

SUMMARY

In accordance with an embodiment, a method is provided for integrating a first nanosheet transistor and a second nanosheet transistor on a single chip. The method includes constructing the first nanosheet transistor by forming a first nanosheet stack including alternating layers of a first material and a second material over a substrate, forming a dummy gate and first spacers over the first nanosheet stack, selectively etching the alternating layers of the first material to define gaps between the alternating layers of the second material, filling the gaps with second spacers, removing the dummy gate, removing a portion of the first nanosheet stack including layers of the first and second materials, and selectively removing remaining layers of the second material such that a single layer of the first material remains intact to define a single nanosheet channel. The method further includes constructing the second nanosheet transistor by forming a second nanosheet stack having multiple layers of nanosheet channels.

In accordance with an embodiment, a method is provided for integrating a first nanosheet transistor and a second nanosheet transistor on a single chip. The method includes constructing the thick oxide nanosheet transistor by forming a first nanosheet stack by selectively removing alternating layers of first and second materials such that a single layer of the first material remains intact to define a single nanosheet channel, and constructing the thin oxide nanosheet transistor by forming a second nanosheet stack having multiple layers of nanosheet channels.

In accordance with another embodiment, a semiconductor device is provided for integrating a first nanosheet transistor and a second nanosheet transistor on a single chip. The first nanosheet transistor includes a first nanosheet stack having alternating layers of a first material and a second material over a substrate, and a dummy gate and first spacers formed over the first nanosheet stack, wherein formation of the first nanosheet transistor further includes: selectively etching the alternating layers of the first material to define gaps between the alternating layers of the second material, filling the gaps with second spacers, removing the dummy gate, removing a portion of the first nanosheet stack including layers of the first and second materials, and selectively removing remaining layers of the second material such that a single layer of the first material remains intact to define a single nanosheet channel. The second nanosheet transistor includes a second nanosheet stack having multiple layers of nanosheet channels.

In accordance with another embodiment, a semiconductor structure is provided. The semiconductor structure includes a single nanosheet stack formed over a substrate, a first nanosheet transistor formed by fabricating a first portion of the single nanosheet stack, the first nanosheet transistor having a single layer of nanosheet channel, and a second nanosheet transistor formed by fabricating a second portion of the single nanosheet stack, the first and second nanosheet transistors integrated on a single chip, and the second nanosheet transistor having multiple layers of nanosheet channels.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for integrating thin and thick gate dielectric nanosheet transistors. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage and analog applications.

Embodiments in accordance with the present invention provide methods and devices for integrating thin and thick gate dielectric nanosheet transistors by employing a thick oxide transistor having a single layer of nano sheet channel and a thin oxide transistor having multiple layers of nanosheet channels. The thick oxide transistor is compatible with the thin oxide transistor. Moreover, the thick oxide gate nanosheet structure can be incorporated on a single chip with the thin oxide gate nanosheet structure. Thus, a thick oxide MOSFET with a single layer nanosheet channel can be compatible with a thin oxide MOSFET having multiple layers of nanosheet channels. Stated differently, the thick oxide MOSFET with a single layer nanosheet channel can be compatible with logic nanosheet MOSFETs.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
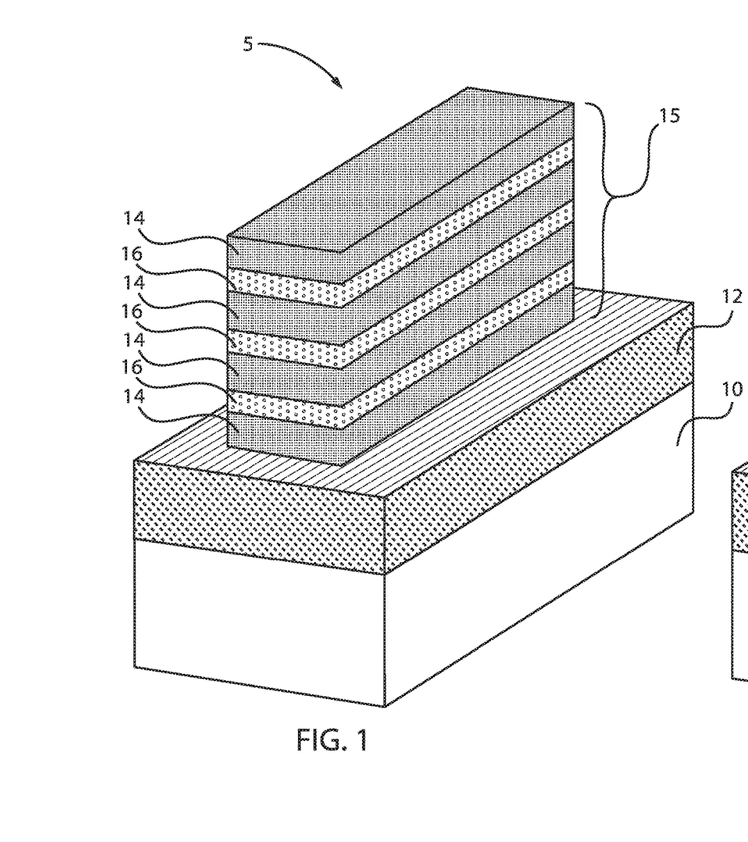
FIG. 1 is a perspective view of a semiconductor structure including a nanosheet stack formed over a substrate, in accordance with an embodiment of the present invention.

FIG. 1 is a perspective view of a semiconductor structure including a nanosheet stack formed over a substrate, in accordance with an embodiment of the present invention.

In various example embodiments, a structure 5 includes a dielectric layer 12 which is formed over a substrate 10. The dielectric layer 12 can be, e.g., an oxide layer and the substrate can be, e.g., a silicon (Si) substrate. A nanosheet stack 15 can be formed over the dielectric layer 12. The nanosheet stack 15 can include alternating layers of a first material 14 and a second material 16. The first material 14 can be, e.g., silicon germanium (SiGe) and the second material 16 can be, e.g., silicon (Si).

Figure 2:
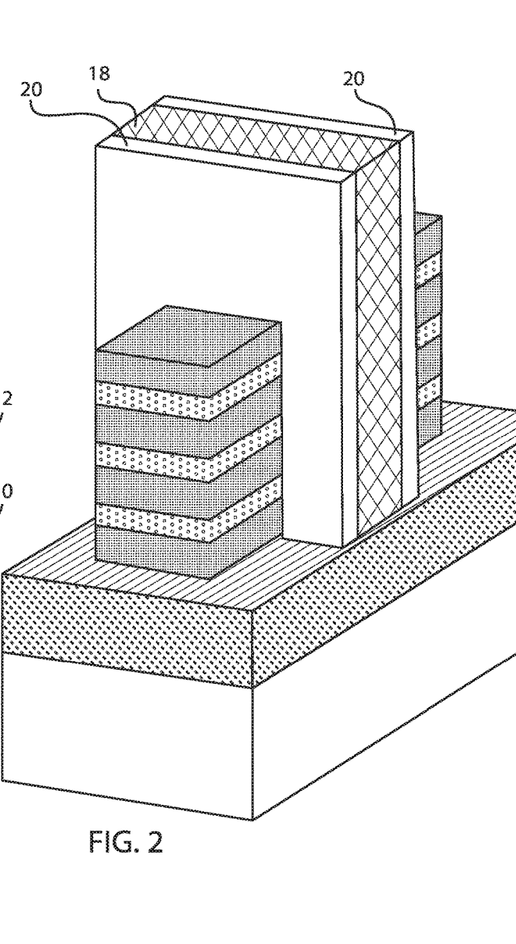
FIG. 2 is a perspective view of the semiconductor structure of FIG. 1 where a dummy gate and spacers are formed over the nano sheet stack, in accordance with an embodiment of the present invention.

FIG. 2 is a perspective view of the semiconductor structure of FIG. 1 where a dummy gate and spacers are formed over the nano sheet stack, in accordance with an embodiment of the present invention.

In various example embodiments, a dummy gate 18 and spacers 20 are formed over the nanosheet stack 15. Spacers 20 can be referred to as cladding spacers.

Figure 3:
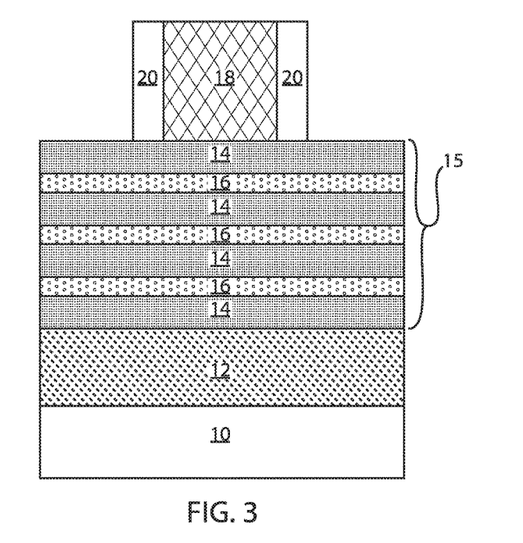
FIG. 3 is a cross-sectional view of the semiconductor structure of FIG. 2 depicting the dummy gate and spacers formed over the nano sheet stack, in accordance with an embodiment of the present invention.

FIG. 3 is a cross-sectional view of the semiconductor structure of FIG. 2 depicting the dummy gate and spacers formed over the nano sheet stack, in accordance with an embodiment of the present invention.

The cross-sectional view is perpendicular to the dummy gate 18 and through the nanosheet stack 15. The cross-sectional view depicts the nanosheet stack 15 over the dielectric layer 12, which in turn is formed over the substrate 10. Additionally, the dummy gate 18 and spacers 20 are shown formed over the nanosheet stack 15. The nanosheet stack 15 can include multiple alternating layers of SiGe and Si.

Figure 4:
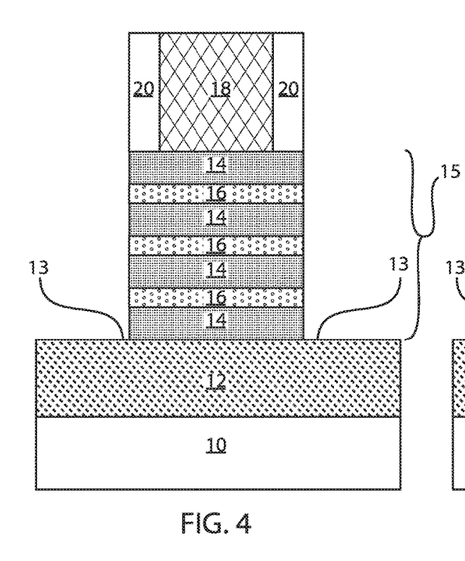
FIG. 4 is a cross-sectional view of the semiconductor structure of FIG. 3 where the nanosheet structure is recessed, in accordance with an embodiment of the present invention.

FIG. 4 is a cross-sectional view of the semiconductor structure of FIG. 3 where the nanosheet structure is recessed, in accordance with an embodiment of the present invention.

In various example embodiments, the nanosheet stack 15 is etched in a source and/or drain region. The etching exposes a top surface 13 of the dielectric layer 12.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

Figure 5:
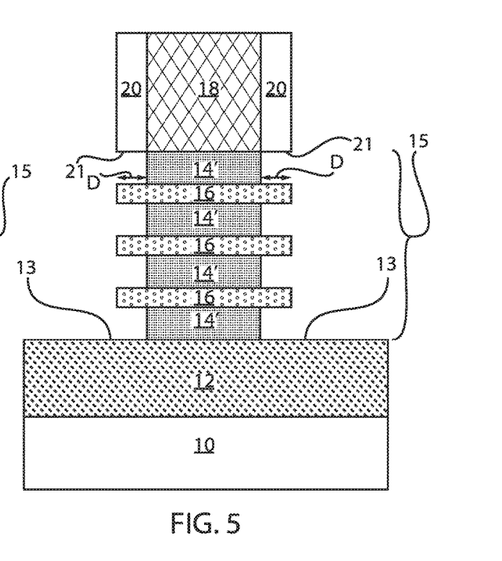
FIG. 5 is a cross-sectional view of the semiconductor structure of FIG. 4 where layers of a first material of the nanosheet structure are etched to create voids or gaps for subsequent inner spacer formation, in accordance with an embodiment of the present invention.

FIG. 5 is a cross-sectional view of the semiconductor structure of FIG. 4 where layers of a first material of the nanosheet structure are etched to create voids or gaps for subsequent inner spacer formation, in accordance with an embodiment of the present invention.

In various example embodiments, the first material 14 (or SiGe) is selectively etched to create voids or gaps for subsequent formation of inner spacers. The gaps extend a distance "D" into the nanosheet stack 15. The remaining first material is designated as 14'. The selective etching of the first material 14 results in the exposure of bottom walls 21 of spacers 20. The distance "D" can be approximately equal to a length of the spacers 20.

Figure 6:
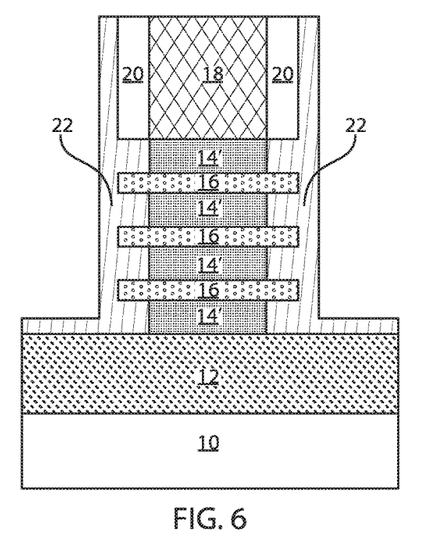
FIG. 6 is a cross-sectional view of the semiconductor structure of FIG. 5 where conformal deposition of inner spacer material takes place, in accordance with an embodiment of the present invention.

FIG. 6 is a cross-sectional view of the semiconductor structure of FIG. 5 where conformal deposition of inner spacer material takes place, in accordance with an embodiment of the present invention.

In various example embodiments, an inner spacer material 22 is deposited over the nanosheet stack 15, over the dummy gate 18, and over the spacers 20. The inner spacer material 22 seals the voids or gaps formed from the selective etching of the first material 14. The inner spacer material 22 surrounds the nanosheet stack 15. The inner spacer material 22 contacts bottom walls 21 and the entire side surfaces of the spacers 20.

Figure 7:
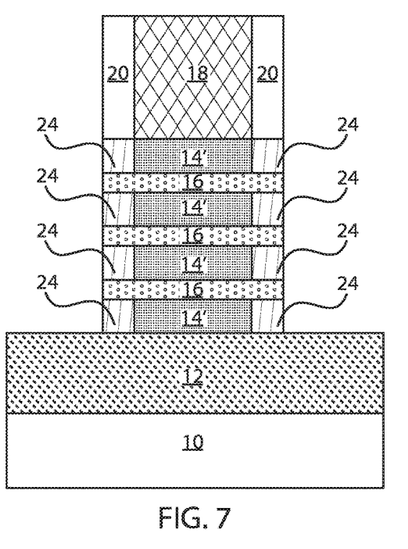
FIG. 7 is a cross-sectional view of the semiconductor structure of FIG. 6 where isotropic removal of inner spacer material is performed to form the inner spacers, in accordance with an embodiment of the present invention.

FIG. 7 is a cross-sectional view of the semiconductor structure of FIG. 6 where isotropic removal of inner spacer material is performed to form the inner spacer, in accordance with an embodiment of the present invention.

In various example embodiments, a portion of the inner spacer material 22 is removed to form inner spacers 24 adjacent the etched first material 14'. The inner spacers 24 can be aligned with the cladding spacers 20. The inner spacers 24 can have a width approximately equal to a width of the cladding spacers 20. The inner spacers 24 contact both the recessed first material 14' and the second material 16.

Figure 8:
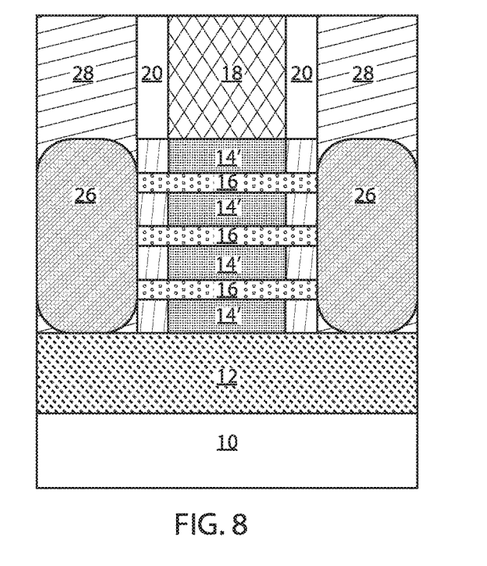
FIG. 8 is a cross-sectional view of the semiconductor structure of FIG. 7 where a source and/or drain, and an inter-level dielectric (ILD) are deposited, in accordance with an embodiment of the present invention.

FIG. 8 is a cross-sectional view of the semiconductor structure of FIG. 7 where a source and/or drain, and an inter-level dielectric (ILD) are deposited, in accordance with an embodiment of the present invention.

In various example embodiments, a source and/or drain 26 and an oxide layer 28 are deposited over the dielectric layer 12 and adjacent the nanosheet stack 15. The oxide layer 28 can be an interlevel dielectric (ILD). In various embodiments, a height of the ILD oxide 28 can be reduced by chemical-mechanical polishing (CMP) and/or etching.

The source and/or drain 26 can contact the inner spacers 24. The source and/or drain 26 can contact a portion of the second material 16 (e.g., Si). The source and/or drain 26 can have a height approximately equal to a height of the nanosheet stack 15. The thickness of source and/or drain 26 can be less than a thickness of the nanosheet stack 15.

Figure 9:
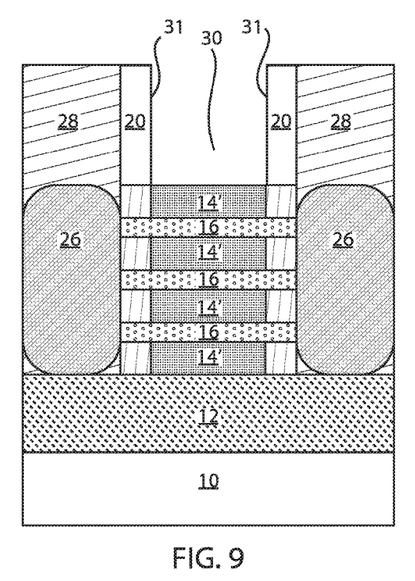
FIG. 9 is a cross-sectional view of the semiconductor structure of FIG. 8 for thick oxide device processing, where the dummy gate is removed, in accordance with an embodiment of the present invention.

FIG. 9 is a cross-sectional view of the semiconductor structure of FIG. 8 for thick oxide device processing, where the dummy gate is removed, in accordance with an embodiment of the present invention.

In various example embodiments, the dummy gate 18 is removed to form a recess 30. The removal of the dummy gate 18 results in the exposure of inner surfaces 31 of the cladding spacers 20.

Figure 10:
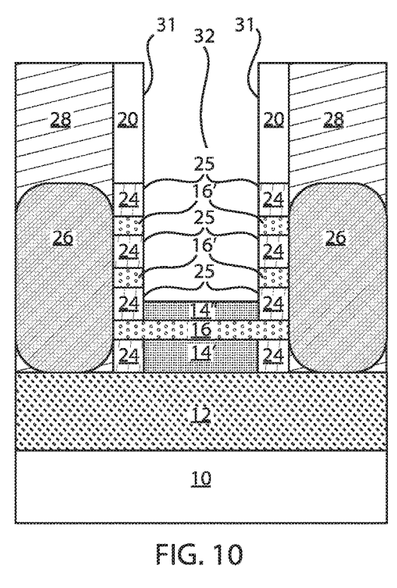
FIG. 10 is a cross-sectional view of the semiconductor structure of FIG. 9 for thick oxide device processing, where a portion of the nanosheet layers are removed, in accordance with an embodiment of the present invention.

FIG. 10 is a cross-sectional view of the semiconductor structure of FIG. 9 for thick oxide device processing, where a portion of the nanosheet layers are removed, in accordance with an embodiment of the present invention.

In various example embodiments, a portion of the nanosheet stack 15 is removed by etching. The etching can be achieved by, e.g., RIE. In one example embodiment, several nanosheet layers are removed such that a single Si layer 16 remains with two SiGe layers 14' and 14" on opposed ends thereof. The SiGe layer 14' can be the one between the Si layer 16 and the dielectric layer 12, whereas the SiGe layer 14" can be the one over the Si layer 16. SiGe layer 14" can be a partially etched layer. The removal of the several nanosheet layers results in the formation of recess 32 within the channel formed between the source and/or drain 26.

Moreover, sections 16' of the second material 16 remain after etching is performed. Such sections 16' are positioned between the inner spacers 24. Such sections 16' are aligned with the cladding spacers 20. Thus, the cladding spacers 20, the inner spacers 24 and the sections 16' of the second material (Si) are substantially aligned. A side surface 25 of the inner spacers 24 is also exposed within the channel.

Figure 11:
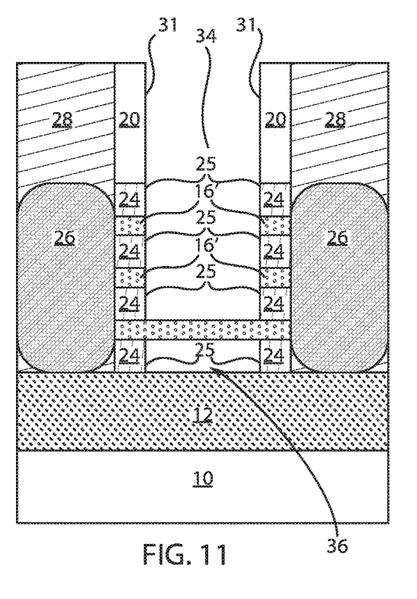
FIG. 11 is a cross-sectional view of the semiconductor structure of FIG. 10 for thick oxide device processing, where selective removal of another layer of the nanosheet structure is performed to employ a remaining bottom nanosheet as a channel, in accordance with an embodiment of the present invention.

FIG. 11 is a cross-sectional view of the semiconductor structure of FIG. 10 for thick oxide device processing, where selective removal of another layer of the nanosheet structure is performed to employ a remaining bottom nanosheet as a channel, in accordance with an embodiment of the present invention.

In various example embodiments, the remaining layers 14' and 14" of the first material (e.g., SiGe) are removed. In particular, remaining layer 14' formed between the dielectric layer 12 and the second material 16 (e.g., Si layer) is removed. Additionally, remaining layer 14" formed over the second material 16 is removed. This results in a single layer 16 of Si remaining within the channel. Stated differently, a single layer of nanosheet channel 16 remains between the source and/or drain 26. This further results in a recess 34 formed over the single layer of nanosheet channel 16, as well as a gap 36 formed between the single layer of nanosheet channel 16 and the dielectric layer 12. Thus, selective removal of SiGe enables formation of a single layer of nanosheet channel 16.

Figure 12:
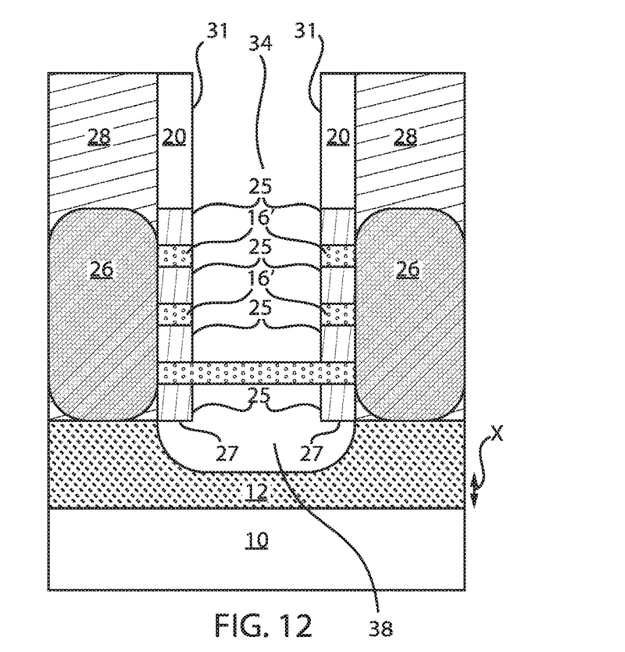
FIG. 12 is a cross-sectional view of the semiconductor structure of FIG. 11 for thick oxide device processing, where selective etching of the oxide formed over the substrate is performed, in accordance with an embodiment of the present invention.

FIG. 12 is a cross-sectional view of the semiconductor structure of FIG. 11 for thick oxide device processing, where selective etching of the oxide formed over the substrate is performed, in accordance with an embodiment of the present invention.

In various example embodiments, the dielectric layer 12 is selectively etched to form a recess 38. The recess 38 can extend a distance "X" within the dielectric layer 12. The formation of recess 38 further results in the exposure of bottom surface 27 of the lowest inner spacers 24. The lowest inner spacers 24 are the ones positioned adjacent to the dielectric layer 12.

Figure 13:
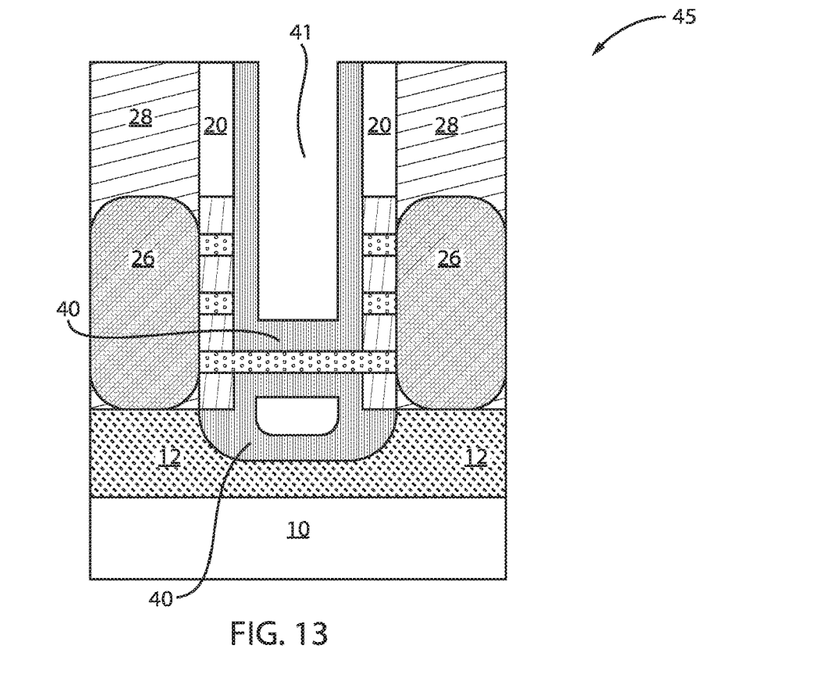
FIG. 13 is a cross-sectional view of the semiconductor structure of FIG. 12 for thick oxide device processing, where a thick gate oxide is deposited, in accordance with an embodiment of the present invention.

FIG. 13 is a cross-sectional view of the semiconductor structure of FIG. 12 for thick oxide device processing, where a thick gate oxide is deposited, in accordance with an embodiment of the present invention.

In various example embodiments, a thick gate oxide 40 is deposited within the channel 41. The thick gate oxide 40 contacts the inner surface 31 of cladding spacers 20 and the inner surface 25 of inner spacers 24. The thick gate oxide 40 further contacts an inner surface of the recess 38 of the dielectric layer 12. The thick gate oxide 40 can be deposited by, e.g., atomic layer deposition (ALD) techniques.

Figure 14:
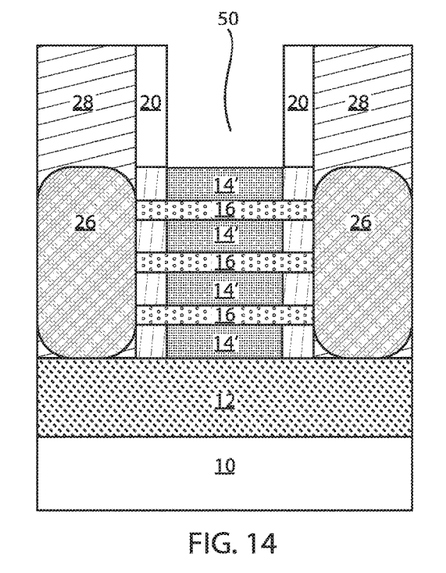
FIG. 14 is a cross-sectional view of the semiconductor structure of FIG. 8 for thin oxide device processing, where the dummy gate is removed, in accordance with an embodiment of the present invention.
Figure 15:
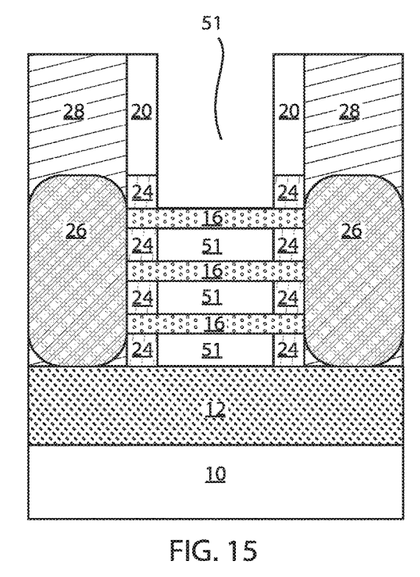
FIG. 15 is a cross-sectional view of the semiconductor structure of FIG. 14 for thin oxide device processing, where a portion of the nanosheet layers are removed, in accordance with an embodiment of the present invention.
Figure 16:
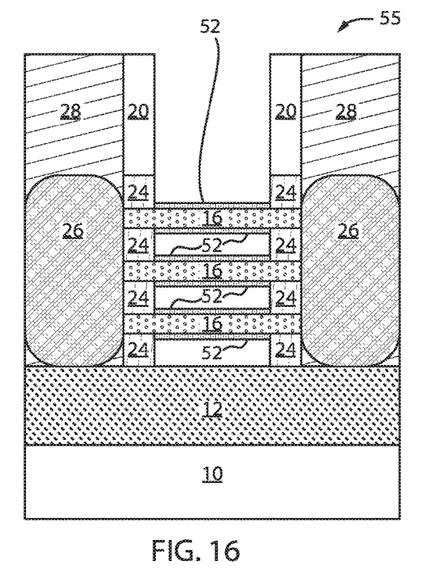
FIG. 16 is a cross-sectional view of the semiconductor structure of FIG. 15 for thin oxide device processing, where a thin gate oxide is formed adjacent remaining layers of the nanosheet structure, in accordance with an embodiment of the present invention.

FIGS. 9-13 described the thick oxide device processing. Stated differently, FIGS. 9-13 described the formation of the thick oxide nanosheet transistor. FIGS. 14-16 below describe thin oxide device processing or formation of the thin oxide nanosheet transistor. The thick oxide nanosheet transistor structure 45 can be incorporated with the thin oxide nanosheet transistor 55 (FIG. 16) on a single chip.

FIG. 14 is a cross-sectional view of the semiconductor structure of FIG. 8 for thin oxide device processing, where the dummy gate is removed, in accordance with an embodiment of the present invention.

In various example embodiments, the dummy gate 18 is removed to form a recess 50. The removal of the dummy gate 18 results in the exposure of inner surfaces of the cladding spacers 20.

FIG. 15 is a cross-sectional view of the semiconductor structure of FIG. 14 for thin oxide device processing, where a portion of the nanosheet layers are removed, in accordance with an embodiment of the present invention.

In various example embodiments, the alternating layers of the first materials 14 are removed. In other words, the SiGe layers 14 are selectively etched such that the alternating layers of the second material 16 remain intact. Gaps 51 are formed between the alternating layers of the second material 16. The second material 16 can be, e.g., Si.

FIG. 16 is a cross-sectional view of the semiconductor structure of FIG. 15 for thin oxide device processing, where a thin gate oxide is formed adjacent remaining layers of the nanosheet structure, in accordance with an embodiment of the present invention.

In various example embodiments, a thin gate oxide 52 is formed on the exposed surfaces of the alternating layers of the second material 16. The thin gate oxide 52 contacts exposed surfaces of all the Si layers 16, as well as small areas of the surface 25 of the inner spacers 24. The thin gate oxide 52 does not contact the inner surfaces of the cladding spacers 20. The thin oxide nanosheet transistor 55 is now formed.

Figure 17:
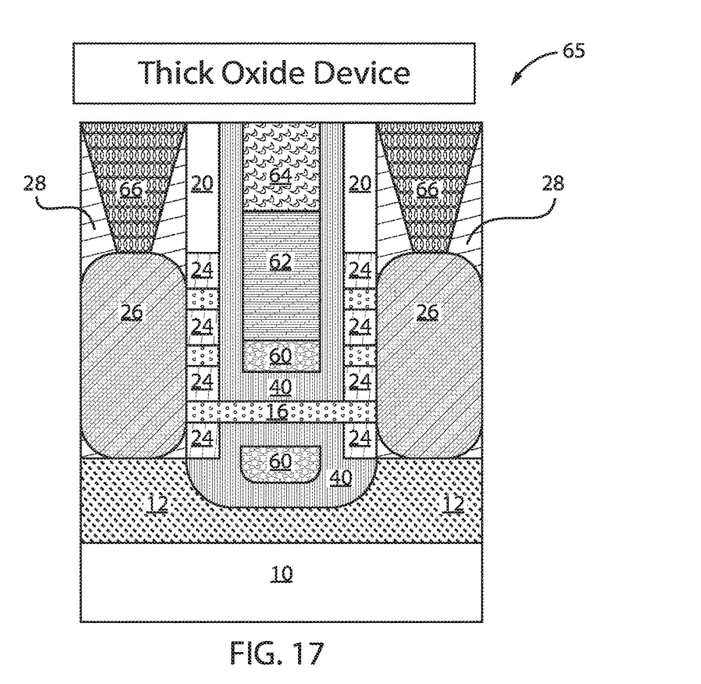
FIG. 17 is a cross-sectional view of the completed thick oxide transistor where a high-k work function metal, a gate stack, a self-aligned contact (SAC) cap, and contacts are formed in the structure of FIG. 13, in accordance with an embodiment of the present invention.

FIG. 17 is a cross-sectional view of the completed thick oxide transistor where a high-k work function metal, a gate stack, a self-aligned contact (SAC) cap, and contacts are formed in the structure of FIG. 13, in accordance with an embodiment of the present invention.

In various example embodiments, regarding the thick oxide device 45, a high-k dielectric plus a work function metal (WFM) 60 is deposited within the channel. Subsequently, a metal layer, such as a tungsten (W) layer 62 is deposited over a portion of the WFM 60. A self-aligned contact (SAC) cap 64 is then formed over the tungsten layer 62. Source and/or drain contacts 66 are formed in the ILD 28 that extend up to the source and/or drain 26.

Figure 18:
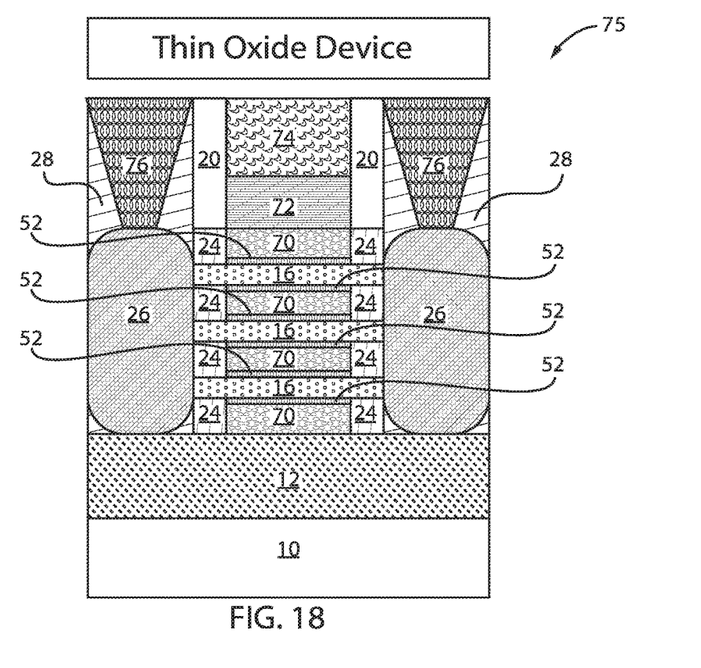
FIG. 18 is a cross-sectional view of the completed thin oxide transistor where a high-k work function metal, a gate stack, a self-aligned contact (SAC) cap, and contacts are formed in the structure of FIG. 16, in accordance with an embodiment of the present invention.

FIG. 18 is a cross-sectional view of the completed thin oxide transistor where a high-k work function metal, a gate stack, a self-aligned contact (SAC) cap, and contacts are formed in the structure of FIG. 16, in accordance with an embodiment of the present invention.

In various example embodiments, similarly to FIG. 17, regarding the thin oxide device 55, a high-k dielectric plus a work function metal (WFM) 70 is deposited within the channel and adjacent the alternating layers of Si 16 and in direct contact with the thin gate oxide 52. Subsequently, a metal layer, such as a tungsten (W) layer 72 is deposited over a portion of the WFM 70. A self-aligned contact (SAC) cap 74 is then formed over the tungsten layer 72. Source and/or drain contacts 76 are then formed in the ILD 28 that extend up to the source and/or drain 26.

Therefore, the thick oxide gate nanosheet structure 65 can be incorporated on a single chip with the thin gate nanosheet structure 75. Thus, a thick oxide MOSFET with a single layer nanosheet channel can be compatible with a thin oxide MOSFET having multiple layers of nanosheet channels. Stated differently, the thick oxide MOSFET with a single layer nanosheet channel can be compatible with logic nanosheet MOSFETs.

Figure 19:
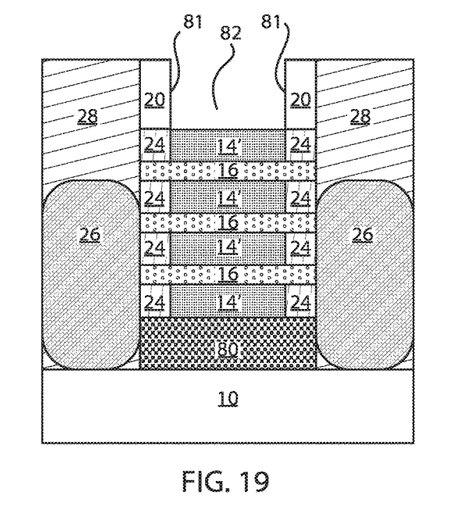
FIG. 19 is a cross-sectional view of a semiconductor structure for thick oxide device processing, where a dielectric layer is formed over the substrate and the dummy gate is removed, in accordance with another embodiment of the present invention.

FIG. 19 is a cross-sectional view of a semiconductor structure for thick oxide device processing, where a dielectric layer is formed over the substrate and the dummy gate is removed, in accordance with another embodiment of the present invention.

In various example embodiments, a dielectric layer 80 is deposited within the channel and directly under the nanosheet stack 15. The source and/or drain 26 do not sit on the dielectric layer 80, as in FIG. 8. Instead, the dielectric layer 80 contacts an inner surface of the source and/or drain 26. Additionally, the dummy gate 18 is removed to form recess 82 to expose inner surfaces 81 of cladding spacers 20.

Figure 20:
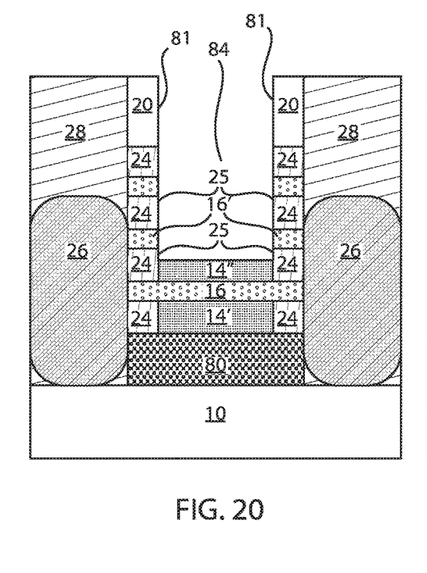
FIG. 20 is a cross-sectional view of the semiconductor structure of FIG. 19 for thick oxide device processing, where a portion of the nanosheet layers are removed, in accordance with an embodiment of the present invention.

FIG. 20 is a cross-sectional view of the semiconductor structure of FIG. 19 for thick oxide device processing, where a portion of the nanosheet layers are removed, in accordance with an embodiment of the present invention.

In various example embodiments, a portion of the nanosheet stack 15 is removed by etching. The etching can be achieved by, e.g., RIE. In one example embodiment, several nanosheet layers are removed such that a single Si layer 16 remains with two SiGe layers 14' and 14" on opposed ends thereof. The SiGe layer 14' can be the one between the Si layer 16 and the dielectric layer 80, whereas the SiGe layer 14" can be the one over the Si layer 16. SiGe layer 14" can be a partially etched layer. The removal of the several nanosheet layers results in the formation of recess 84 within the channel formed between the source and/or drain 26.

Moreover, sections 16' of the second material 16 remain after etching is performed. Such sections 16' are positioned between the inner spacers 24. Such sections 16' are aligned with the cladding spacers 20. Thus, the cladding spacers 20, the inner spacers 24 and the sections 16' of the second material are substantially aligned. A side surface 25 of the inner spacers 24 is also exposed within the channel.

Figure 21:
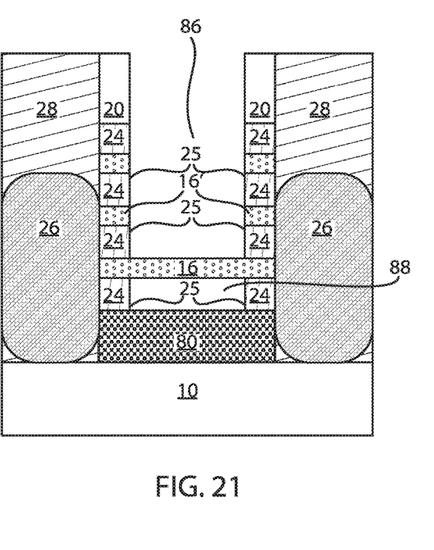
FIG. 21 is a cross-sectional view of the semiconductor structure of FIG. 20 for thick oxide device processing, where selective removal of another layer of the nanosheet structure is performed to use a remaining bottom nanosheet as a channel, in accordance with an embodiment of the present invention.

FIG. 21 is a cross-sectional view of the semiconductor structure of FIG. 20 for thick oxide device processing, where selective removal of another layer of the nanosheet structure is performed to use a remaining bottom nanosheet as a channel, in accordance with an embodiment of the present invention.

In various example embodiments, the remaining layers 14' and 14" of the first material (e.g., SiGe) are removed. In particular, remaining layer 14' formed between the dielectric layer 80 and the second material 16 (e.g., Si layer) is removed. Additionally, remaining layer 14" formed over the second material 16 is removed. This results in a single layer of Si remaining within the channel. Stated differently, a single layer of nanosheet channel 16 remains between the source and/or drain 26. This further results in a recess 86 formed over the single layer of nanosheet channel 16, as well as a gap 88 formed between the single layer of nanosheet channel 16 and the dielectric layer 80. Thus, selective removal of SiGe enables formation of a single layer of nanosheet channel 16.

Figure 22:
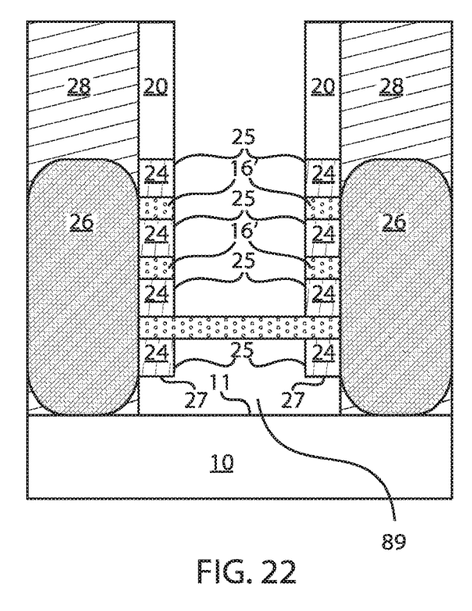
FIG. 22 is a cross-sectional view of the semiconductor structure of FIG. 21 for thick oxide device processing, where selective etching of the dielectric formed over the substrate is performed, in accordance with an embodiment of the present invention.

FIG. 22 is a cross-sectional view of the semiconductor structure of FIG. 21 for thick oxide device processing, where selective etching of the dielectric formed over the substrate is performed, in accordance with an embodiment of the present invention.

In various example embodiments, the dielectric layer 80 is etched away to form a recess 89. The formation of recess 89 further results in the exposure of bottom surface 27 of the lowest inner spacers 24. The etching of the dielectric layer 80 also results in the exposure of the top surface 11 of substrate 10.

Figure 23:
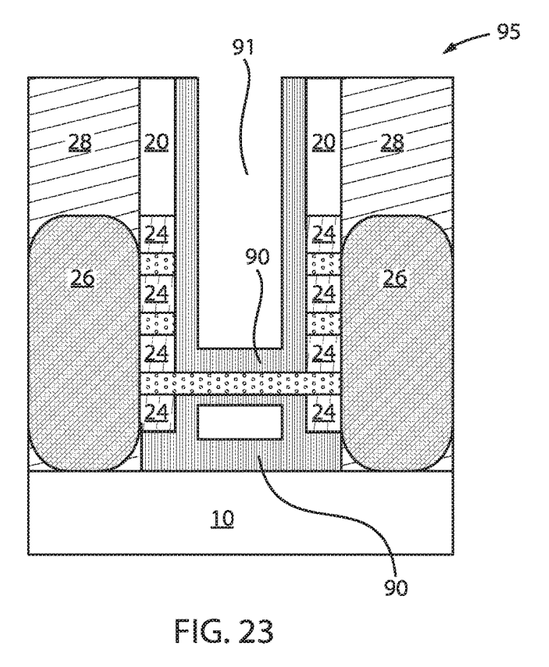
FIG. 23 is a cross-sectional view of the semiconductor structure of FIG. 22 for thick oxide device processing, where a thick gate oxide is deposited, in accordance with an embodiment of the present invention.

FIG. 23 is a cross-sectional view of the semiconductor structure of FIG. 22 for thick oxide device processing, where a thick gate oxide is deposited, in accordance with an embodiment of the present invention.

In various example embodiments, a thick gate oxide 90 is deposited within the channel 91. The thick gate oxide 90 contacts the inner surface 81 of cladding spacers 20 and the inner surface 25 of inner spacers 24. The thick gate oxide 90 further contacts an inner surface of the recess 89. The thick gate oxide 90 can be deposited by, e.g., atomic layer deposition (ALD) techniques.

Figure 24:
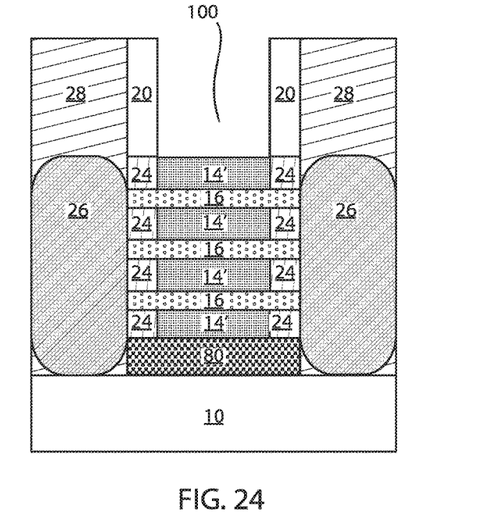
FIG. 24 is a cross-sectional view of a semiconductor structure for thin oxide device processing, where a dielectric layer is formed over the substrate and the dummy gate is removed, in accordance with an embodiment of the present invention.
Figure 25:
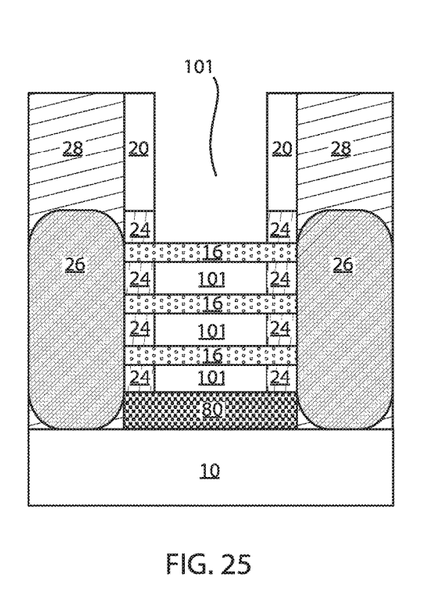
FIG. 25 is a cross-sectional view of the semiconductor structure of FIG. 24 for thin oxide device processing, where a portion of the nanosheet layers are removed, in accordance with an embodiment of the present invention.
Figure 26:
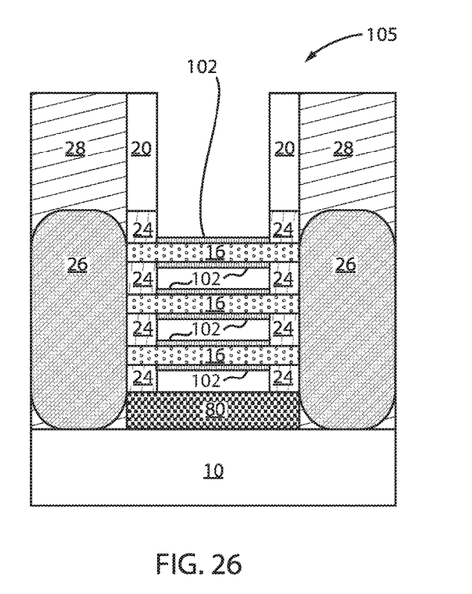
FIG. 26 is a cross-sectional view of the semiconductor structure of FIG. 25 for thin oxide device processing, where a thin gate oxide is formed adjacent remaining layers of the nanosheet structure, in accordance with an embodiment of the present invention.

FIGS. 19-23 described the thick oxide device processing. Stated differently, FIGS. 19-23 described the formation of the thick oxide nanosheet transistor. FIGS. 24-26 below describe thin oxide device processing or formation of the thin oxide nanosheet transistor. The thick oxide nanosheet transistor structure 95 can be incorporated with the thin oxide nanosheet transistor 105 (FIG. 26) on a single chip.

FIG. 24 is a cross-sectional view of a semiconductor structure for thin oxide device processing, where a dielectric layer is formed over the substrate and the dummy gate is removed, in accordance with an embodiment of the present invention.

In various example embodiments, the dummy gate 18 is removed to form a recess 100.

FIG. 25 is a cross-sectional view of the semiconductor structure of FIG. 24 for thin oxide device processing, where a portion of the nanosheet layers are removed, in accordance with an embodiment of the present invention.

In various example embodiments, the alternating layers of the first materials 14 are removed. In other words, the SiGe layers 14 are selectively etched such that the alternating layers of the second material 16 remain intact. Gaps 101 are formed between the alternating layers of the second material 16. The second material 16 can be Si.

FIG. 26 is a cross-sectional view of the semiconductor structure of FIG. 25 for thin oxide device processing, where a thin gate oxide is formed adjacent remaining layers of the nanosheet structure, in accordance with an embodiment of the present invention.

In various example embodiments, a thin gate oxide 102 is formed on the exposed surfaces of the alternating layers of the second material 16. The thin gate oxide 102 contacts exposed surfaces of all the Si layers 16, as well as small areas of the surface 25 of the inner spacers 24. The thin gate oxide 102 does not contact the inner surfaces of the cladding spacers 20. The thin oxide nanosheet transistor 105 is now formed.

Figure 27:
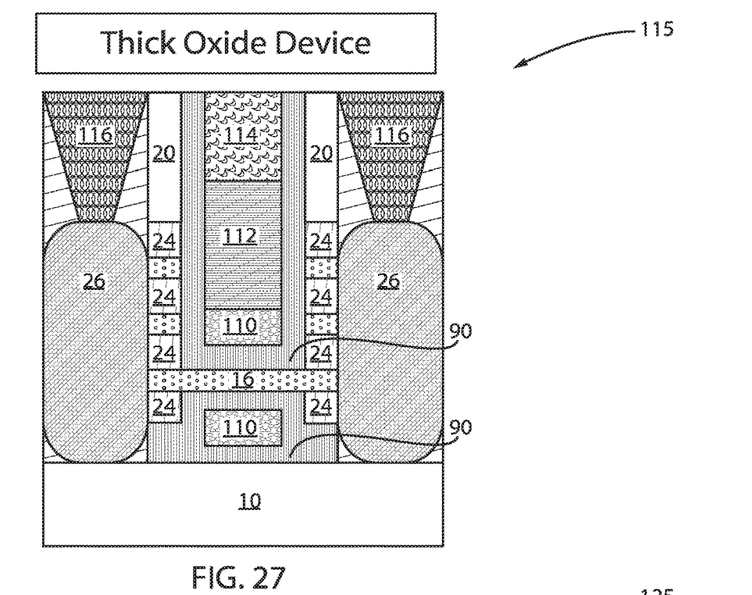
FIG. 27 is a cross-sectional view of the completed thick oxide transistor where a high-k work function metal, a gate stack, a self-aligned contact (SAC) cap, and contacts are formed in the structure of FIG. 23, in accordance with an embodiment of the present invention.

FIG. 27 is a cross-sectional view of the completed thick oxide transistor where a high-k work function metal, a gate stack, a self-aligned contact (SAC) cap, and contacts are formed in the structure of FIG. 23.

In various example embodiments, regarding the thick oxide device 95, a high-k dielectric plus a work function metal (WFM) 110 is deposited within the channel. Subsequently, a metal layer, such as a tungsten (W) layer 112 is deposited over a portion of the WFM 110. A self-aligned contact (SAC) cap 114 is then formed over the tungsten layer 112. Source and/or drain contacts 116 are formed in the ILD 28 that extend up to the source and/or drain 26.

Figure 28:
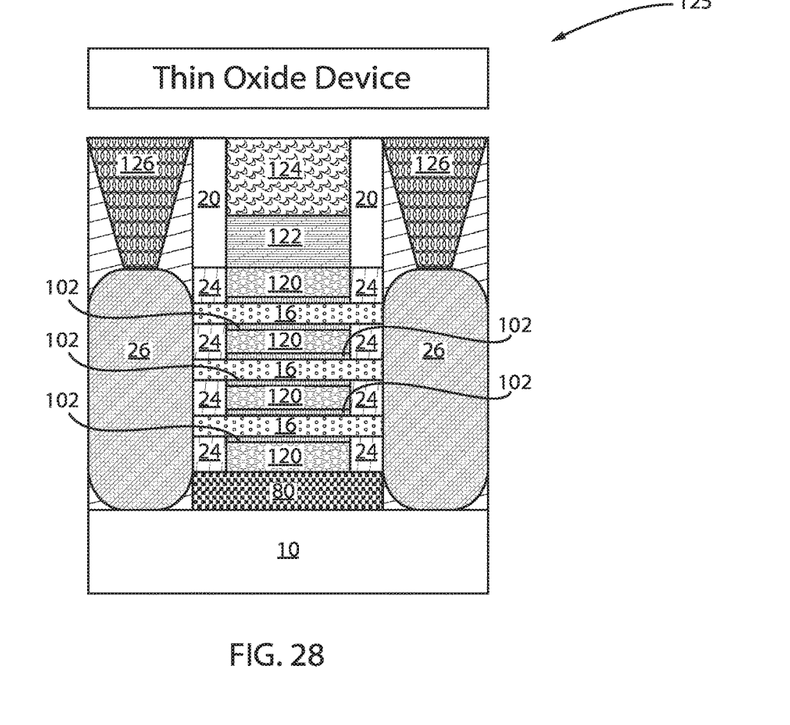
FIG. 28 is a cross-sectional view of the completed thin oxide transistor where a high-k work function metal, a gate stack, a self-aligned contact (SAC) cap, and contacts are formed in the structure of FIG. 26, in accordance with an embodiment of the present invention.

FIG. 28 is a cross-sectional view of the completed thin oxide transistor where a high-k work function metal, a gate stack, a self-aligned contact (SAC) cap, and contacts are formed in the structure of FIG. 26.

In various example embodiments, similarly to FIG. 27, regarding the thin oxide device 105, a high-k dielectric plus a work function metal (WFM) 120 is deposited within the channel and adjacent the alternating layers of Si 16 and in direct contact with the thin gate oxide 102. Subsequently, a metal layer, such as a tungsten (W) layer 122 is deposited over a portion of the WFM 120. A self-aligned contact (SAC) cap 124 is then formed over the tungsten layer 122. Source and/or drain contacts 126 are then formed in the ILD 28 that extend up to the source and/or drain 26.

Therefore, the thick oxide gate nanosheet structure 115 can be incorporated on a single chip with the thin gate nanosheet structure 125. Thus, a thick oxide MOSFET with a single layer nanosheet channel can be compatible with a thin oxide MOSFET having multiple layers of nanosheet channels. Stated differently, the thick oxide MOSFET with a single layer nanosheet channel can be compatible with logic nanosheet MOSFETs.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for integrating a first nanosheet transistor and a second nanosheet transistor on a single chip (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a first nanosheet transistor and a second nanosheet transistor, the method comprising:
    constructing the first nanosheet transistor by:
        forming a first nanosheet stack including alternating layers of a first material and a second material over a substrate;
        forming a dummy gate and first spacers over the first nanosheet stack;
        selectively etching the alternating layers of the first material to define gaps between the alternating layers of the second material;
        filling the gaps with second spacers;
        removing the dummy gate;
        removing a portion of the first nanosheet stack including layers of the first and second materials; and
        selectively removing remaining layers of the second material such that a single layer of the first material remains intact to define a single nanosheet channel; and
    constructing the second nanosheet transistor by:
        forming a second nanosheet stack having multiple layers of nanosheet channels.

2. The method of claim 1, wherein the first nanosheet transistor is a thick oxide nanosheet transistor and the second nanosheet transistor is a thin oxide nanosheet transistor.

3. The method of claim 1, wherein the first material is silicon germanium (SiGe) and the second material is silicon (Si).

4. The method of claim 1, wherein a first dielectric layer is formed between the first nanosheet stack and the substrate.

5. The method of claim 4, wherein the first dielectric layer is selectively etched to form a recess.

6. The method of claim 5, wherein a second dielectric layer is deposited adjacent the single nanosheet channel and the recess.

7. The method of claim 1, wherein the multiple layers of the second nanosheet stack are silicon (Si) layers.

8. The method of claim 7, wherein a third dielectric is deposited adjacent each of the Si layers of the second nanosheet stack.

9. A method for forming a thick oxide nano sheet transistor and a thin oxide nanosheet transistor, the method comprising:
    constructing the thick oxide nanosheet transistor by forming a first nanosheet stack by selectively removing alternating layers of first and second materials such that a single layer of the first material remains intact to define a single nanosheet channel; and
    constructing the thin oxide nanosheet transistor by forming a second nanosheet stack having multiple layers of nanosheet channels.

10. The method of claim 9, wherein the constructing of the thick oxide nanosheet transistor further includes:
    forming a dummy gate and first spacers over the thick nanosheet stack; and
    selectively etching the alternating layers of the first material to define gaps between the alternating layers of the second material.

11. The method of claim 10, wherein the constructing of the thick oxide nanosheet transistor further includes:
    filling the gaps with second spacers; and
    removing the dummy gate before selectively removing the alternating layers of first and second materials.

12. A semiconductor structure, comprising:
    a single nanosheet stack formed over a substrate;
    a first nanosheet transistor formed by fabricating a first portion of the single nanosheet stack, the first nanosheet transistor having a single layer of nanosheet channel; and
    a second nanosheet transistor formed by fabricating a second portion of the single nanosheet stack, the second nanosheet transistor having multiple layers of nanosheet channels.

13. The structure of claim 12, wherein the first nanosheet transistor is a thick oxide nanosheet transistor and the second nanosheet transistor is a thin oxide nanosheet transistor.

14. The structure of claim 13, wherein the single layer of nanosheet channel of the thick oxide nanosheet transistor includes a silicon (Si) layer.

15. The structure of claim 14, wherein a thick gate oxide contacts opposed ends of the single layer of nanosheet channel of the thick oxide nanosheet transistor.

16. The structure of claim 15, wherein a work function metal is deposited within a channel formed over the single layer of nanosheet channel of the thick oxide nanosheet transistor.

17. The structure of claim 13, wherein the multiple layers of nanosheet channels of the thin oxide nanosheet transistor include Si layers.

18. The structure of claim 17, wherein the Si layers are alternating layers defining the multiple layers of nanosheet channels of the thin oxide nanosheet transistor.

19. The structure of claim 18, wherein a thin gate oxide contacts opposed ends of each of the multiple layers of the nanosheet channels of the thin oxide nanosheet transistor.

20. The structure of claim 19, wherein a work function metal is deposited within a channel formed over the multiple layers of the nanosheet channels of the thin oxide nanosheet transistor.

* * * * *